(12) United States Patent
Milosavljevic et al.

(10) Patent No.: US 7,534,672 B1
(45) Date of Patent: May 19, 2009

(54) TIERED GATE DEVICE WITH SOURCE AND DRAIN EXTENSIONS

(75) Inventors: Ivan Milosavljevic, Thousand Oaks, CA (US); Adele Schmitz, Thousand Oaks, CA (US); Michael Antcliffe, Los Angeles, CA (US); Ming Hu, Cerritos, CA (US)

(73) Assignee: HRL Laboratories, LLC, Malibu, CA (US)

( * ) Notice: Subject to any disclaimer, the term of this patent is extended or adjusted under 35 U.S.C. 154(b) by 0 days.

(21) Appl. No.: 11/517,791

(22) Filed: Sep. 8, 2006

(51) Int. Cl.
*H01L 21/338* (2006.01)
(52) U.S. Cl. .............................. 438/182; 257/E21.232; 257/E21.038
(58) Field of Classification Search .......... 257/E21.038, 257/E21.232; 438/182
See application file for complete search history.

(56) References Cited

U.S. PATENT DOCUMENTS

| | | | |
|---|---|---|---|
| 5,053,348 A * | 10/1991 | Mishra et al. ............... 438/571 |
| 5,770,525 A | 6/1998 | Kamiyama | |
| 6,204,102 B1 * | 3/2001 | Yoon et al. ................... 438/182 |
| 7,041,541 B2 * | 5/2006 | Behammer ................... 438/182 |
| 7,387,955 B2 * | 6/2008 | Ahn et al. .................... 438/574 |
| 2003/0119233 A1 * | 6/2003 | Koganei ...................... 438/182 |
| 2004/0063303 A1 * | 4/2004 | Behammer ................... 438/585 |
| 2004/0082158 A1 * | 4/2004 | Whelan et al. ............... 438/606 |
| 2007/0134862 A1 * | 6/2007 | Lim et al. .................... 438/197 |

OTHER PUBLICATIONS

USPTO Notice of Allowance and Fees Due, mailed Jul. 25, 2008 for U.S. Appl. No. 11/150,439, filed Jun. 11, 2005, inventor Milosavljevic.
USPTO Office Action (OA) mailed Nov. 29, 2007 for U.S. Appl. No. 11/150,439, filed Jun. 11, 2005, inventor Milosavljevic.

\* cited by examiner

*Primary Examiner*—N Drew Richards
*Assistant Examiner*—Grant S Withers
(74) *Attorney, Agent, or Firm*—Christopher R. Balzan

(57) ABSTRACT

In one embodiment, a tiered gate device is provided including a source, a drain, and a gate foot therebetween. A gate head is attached to the gate foot. A source extension extends from on the source toward the gate foot along the substrate. In some embodiments a drain extension extends from on the drain toward the gate foot along the substrate.

25 Claims, 4 Drawing Sheets

TIERED GATE DEVICE WITH SOURCE AND DRAIN EXTENSIONS

CROSS-REFERENCE TO RELATED APPLICATIONS

The present application is related to U.S. patent application Ser. No. 11/150,439, by Milosavljevic, et al., entitled "METHOD FOR PRODUCING TIERED GATE STRUCTURE DEVICES, filed on Jun. 11, 2005, and to U.S. patent application Ser. No. 11/517,685, filed concurrently herewith, by Milosavljevic, et al., entitled PASSIVATED TIERED GATE STRUCTURE TRANSISTOR AND FABRICATION METHOD, both herein incorporated by reference in their entireties.

BACKGROUND

FIG. 1 shows a cross sectional side view of a T-gate device 100. The T-gate device 100 includes a T-gate structure 105 formed on a substrate 125 between a source 115 and a drain 120. The T-gate structure 105 often has a T-shaped gate 105, referred to as simply a T-gate. In general a T-gate is any device which has a narrow gate foot 130 and a relatively wider gate head 110. Sometimes the same or similar structures are referred to as Y-gates and/or mushroom gates due to their final shape. In yet another instance, a gamma-gate or asymmetric gate can be produced. A gamma-gate has a cross section similar to the Greek letter gamma. Accordingly, the terms T-gate, Y-gate, mushroom gate, gamma-gate, and asymmetric gate refer to a tiered gate structure with a narrow gate foot 130 and a relatively wider gate head 110. In this disclosure the term T-gate, the most general and widely used term to refer to such tiered gate structure devices, is intended to encompass all of these structural variations.

T-gate structures, structures with a gate foot 130 smaller than the gate head 110 contact area, can operate at ultra-high frequencies. The T-gate structure allows the source and drain contacts to be moved closer to the gate structure to increase speed and decrease power consumption. Moving the source and drain too close to the gate structure, however, can cause shorts between the source or drain contact and the gate head.

In light of the above, there exists a need for a structure and method of manufacturing to provide a T-gate capable of higher frequency performance without causing shorting between the gate head and the source or drain contact of the T-gate device.

SUMMARY

In one implementation, a method is provided for fabricating a tiered gate device. The method includes forming a source and a drain on a substrate with a gate foot therebetween. The method includes forming a source extension extending from on the source to and along the substrate toward the gate foot, the source extension electrically contacting the source. A gate head is formed on the gate foot. In some implementations a drain extension is formed extending from on the drain to and along the substrate toward the gate foot.

In one embodiment, a tiered gate device is provided including a source, a drain, and a gate foot therebetween. A gate head is attached to the gate foot. A source extension extends from on the source toward the gate foot along the substrate. In some embodiments a drain extension extends from on the drain toward the gate foot along the substrate.

In one embodiment, a tiered gate device is provided including a source, a drain, and a gate foot therebetween. A gate head is attached to the gate foot. In this embodiment, a source extension extends from the source under the gate head and a drain extension extends from the drain under the gate head.

BRIEF DESCRIPTION OF THE DRAWINGS

The features and advantages of the present invention will be better understood with regard to the following description, appended claims, and accompanying drawings where:

DESCRIPTION

In the description of the invention that follows, like numerals or reference designators will be used to refer to like parts throughout. Furthermore, the FIGS. are for illustrative purposes and are not necessarily to scale.

Figure 1:
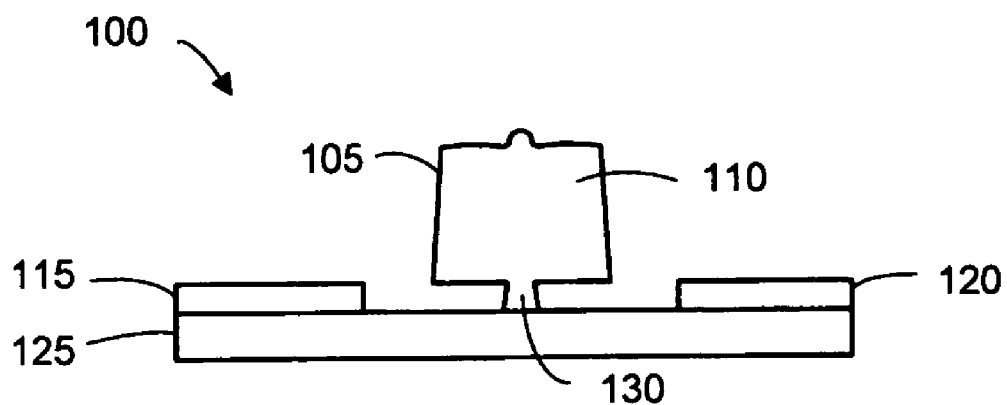
FIG. 1 shows a cross section side view of a T-gate device.

The T-gate device 100 of FIG. 1 is typically a high electron mobility transistor (HEMT). Such a T-gate device 100 has an access resistance including source and drain resistance components. One source resistance component is located in the substrate 125 between the T-shaped gate 105 and the source 115. One drain resistance component is located in the substrate 125 between the T-shaped gate 105 and the drain 120. As operating frequencies increase, the access resistance of the T-gate device 100 becomes a limiting factor. Thus, it may be desirable to reduce the access resistance so that the T-gate device 100 is capable of operating at higher frequencies.

One technique for reducing the access resistance of the T-gate device 100 involves reducing the source resistance component or the drain resistance component. The source resistance component may be reduced by reducing the distance between T-shaped gate 105 and the source 115. Similarly, the drain resistance component may be reduced by reducing the distance between the T-shaped gate 105 and the drain 120. Reducing the source resistance component has a greater effect on the gain than reducing the drain resistance component because the source resistance lowers the gate-to-source voltage, which increases the transconductance of the T-gate device 100.

As discussed above, reducing the distance between the T-shaped gate 105 and the source 115, however, may result in shorting between the gate head 110 and source 115. Similarly, reducing the distance between the T-shaped gate 105 and the drain 120 may result in shorting between the gate head 110 and the drain 120.

Figure 2:
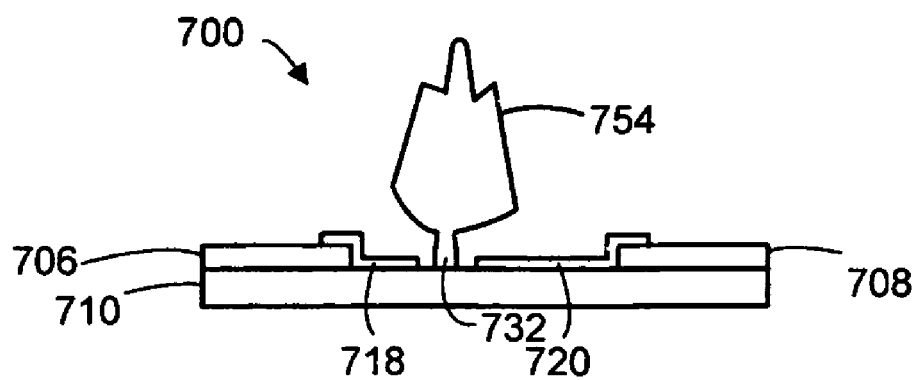
FIG. 2 shows simplified illustration of a side view of an example embodiment of a T-gate structure having source and drain extensions.

FIG. 2 shows simplified illustration of a side view of an example embodiment of a T-gate structure having a source extension 718 extending from the source 706 toward the gate foot 732. In the embodiment of FIG. 2, an optional drain extension 720 extends from the drain 708 toward the gate foot 732. The source extension 718 and drain extension 720 may have thicknesses that are less than the thickness of the respective source 706 and drain 708. The source extension 718 and the drain extension 720 extend under the gate head 754. Because the source extension 718 and the drain extension 720 are thinner than the source 706 and drain 708, they can extend closer to the gate foot 732, and in some embodiments under the gate head 754 as shown, without causing shorting with the gate head 754. The source extension 718 and the drain extension 720 provide lower access resistance to improve device speed. The source extension 718 may be made of metal, which can reduce the source resistance and improve the gain of the T-gate device 700.

In some embodiments (not shown), the source 706 and/or the drain 708 may have a thickness greater than a height of the gate foot 732, if desired. Thus, in some embodiments (not shown), the source 706 and/or the drain 708 may have thicknesses greater than the height of the gate foot 732, such that the height(s) of the source 706 and/or the drain 708 above the substrate 710 is greater than the height of the gate foot 732 above the substrate 710, while the source extension 718 and/or the drain extension 720 have thicknesses that are less than the thicknesses of the respective source 706 and/or drain 708.

Figure 3A:
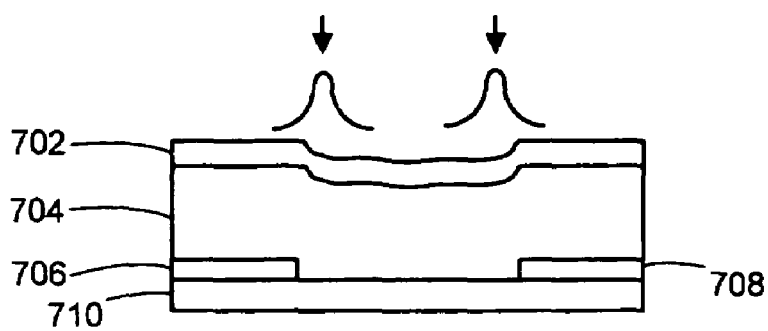
FIGS. 3A-3K are simplified illustrations in cross sectional side view illustrating fabrication of a gate head of a T-gate device in accordance with an implementation of the present invention.

FIGS. 3A-3K are simplified illustrations in cross sectional side view illustrating an example fabrication of the T-gate device 700, of FIG. 2. FIG. 3A shows a semiconductor substrate 710 with two dissimilar resist layers 702 and 704 overlying the source 706, the drain 708, and the substrate 710. The dissimilar resist layers 702 and 704 are selected so that they are based on different solvents and will not intermix. For example, the lower resist layer 704 may be a copolymer resist such as MMA(17.5)/MAA, and the upper resist layer 702 may be PMMA 950K. The lower resist layer 704 may be a high sensitivity resist and the upper resist layer 702 may be a low sensitivity resist. It is possible in some implementations to use a single resist layer rather than two. In one embodiment, the lower resist layer 704 is MMA(17.5)/MMA (copolymer) resist having a thickness of 6000 angstroms, and the upper resist layer 702 is PMMA 950K having a thickness of 1500 angstroms.

A first exposure (indicated as arrows above gaussian curves at the top of FIG. 3A) with a high acceleration e-beam having peak gaussian like profiles defines a source extension opening 711 and a drain extension opening 715 (shown in FIG. 3B) in a mask defined formed from the resist layers 702 and 704. The source extension opening 711 is adjacent the source 706 and should be formed on a portion of the source 706. The drain extension opening 715 is adjacent the drain 708 and should be formed on a portion of the drain 708. The exposure acceleration voltage will depend on the desired thicknesses and types of resist in the upper and lower resist layers 702 and 704. The exposure acceleration voltage for example may be about 50 kV.

Figure 3B:
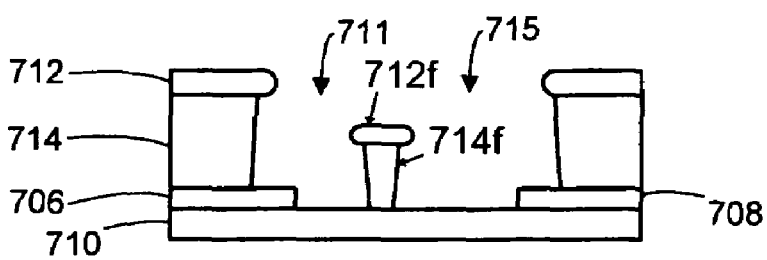

After the first exposure, the resist layers 702 and 704 are developed using two different developers to form a mask including respective resist layers 712 and 714, as shown in FIG. 3B. The first developer does most of the developing of the upper resist layer 702, while the second developer is selective to develop only the lower resist layer 704. Thus, an under cut of the upper resist layer 712 by the lower resist layer 714 is possible with the upper resist layer 712 overhanging the lower resist layer 714, as shown in FIG. 2B. Portions 712*f* and 714*f* of the resist layers 702 and 704, respectively, remain over the substrate 710 between the source extension opening 711 and the drain extension opening 715, and define the length of the source extension 718 and the drain extension 720 along the substrate 710. Referring to FIGS. 3A & 3B, in one possible implementation, MIBK may be used to develop the top resist layer 702 and a substantial portion of the bottom resist layer 704. The remaining portion of the lower resist layer 704 is developed using a PMGEA:ETOH (1:5) solution.

Figure 3C:
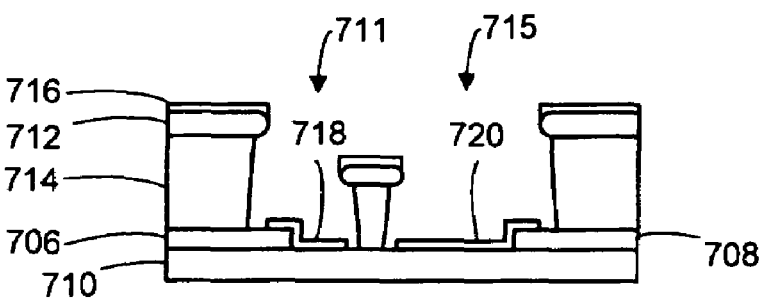

An extension material layer 716 is deposited over the mask formed by the resist layers 712 and 714, as is shown in FIG. 3C. The extension material layer 716 forms a source extension 718 in the source extension opening 711 and a drain extension 720 in the drain extension opening 715. The source extension 718 and the drain extension 720 may be formed by evaporating metal to form a thin metal layers each extending onto the substrate 710 from on the respective source 706 and drain 708.

The source and drain extensions 718 and 720 may be multilayered. For example, in one embodiment the source extension 718 and the drain extension 720 may each include a bottom layer of Au having a thickness of 500 angstroms, a middle layer of Ni having a thickness of 100 angstroms, and a top layer of AuGe having a thickness of 900 angstroms. The source 706, the source extension 718, the drain 708, and the drain extension 720 are then annealed for example in an ambient nitrogen atmosphere at 300 degrees centigrade for 30 seconds.

Figure 3D:
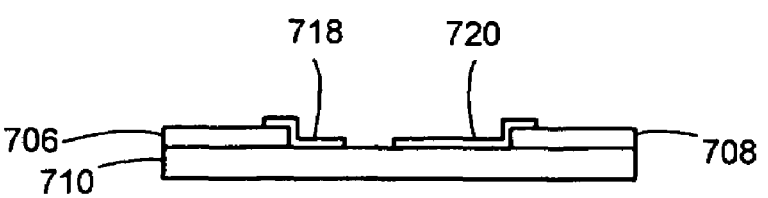

The extension material layer 716 on the top resist layer 712 as well as the top resist layer 712 and the bottom resist layer 714 are then removed leaving the source extension 718 and the drain extension 720 on the substrate 710, as is shown in FIG. 3D. Acetone may be used to remove top and bottom resist layers 712 and 714, in order to remove extension material layer 716, as part of a lift off process.

Figure 3E:
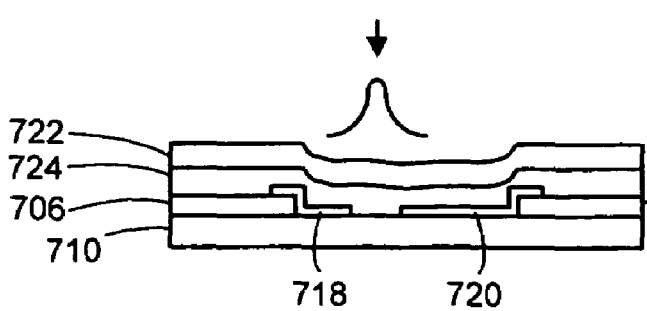

Turning to FIG. 3E, a resist layer 724 is formed over the source 706, the source extension 718, the drain 708, the drain extension 720, and the substrate 710. A dissimilar resist layer 722 is then formed over the resist layer 724. The dissimilar resist layers 722 and 724 are selected so that they are based on different solvents and will not intermix. For example, the lower resist layer 724 may be copolymer resist such as MMA/MAA, and the upper resist layer 722 may be PMMA 950K. The lower resist layer 724 is a high sensitivity resist while the upper resist layer 722 is a low sensitivity resist. It is possible in some implementations to use a single resist layer rather than two.

A second exposure (indicated as an arrow above a gaussian curve at the top of FIG. 3E) with a high acceleration e-beam having a single peak gaussian like profile defines a narrow gate foot opening 725 (shown in FIG. 3F) in the upper and lower resist layers 722 and 724. The exposure acceleration voltage will depend on the desired thicknesses and types of resist in the upper and lower resist layers 722 and 724. The exposure acceleration voltage, for example, may be about 50 kV.

Figure 3F:
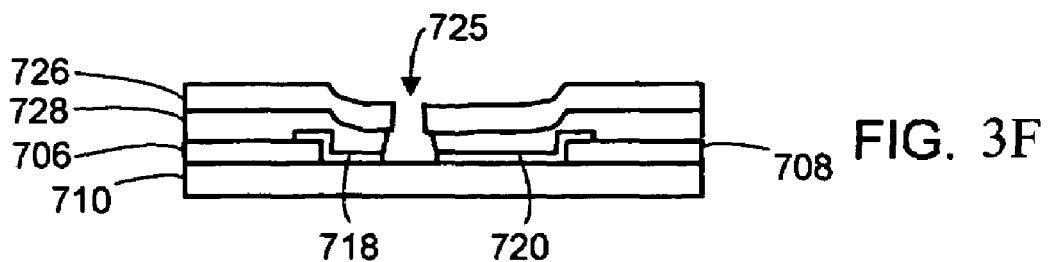

After the second exposure, the resist layers 722 and 724 are developed using two different developers to form the opening 725 through the respective resist layers 726 and 728 shown in FIG. 3F. A first developer causes most of the developing of the upper resist layer 722, while the second developer is selective to develop only the lower resist layer 724. Thus, an under cut of the upper resist layer 726 by the lower resist layer 728 is possible such that the gate foot opening 725 is wider in the lower resist layer 728 than the upper resist layer 726, with the upper resist layer 726 overhanging the lower resist layer 728, as shown in FIG. 3F.

Figure 3G:
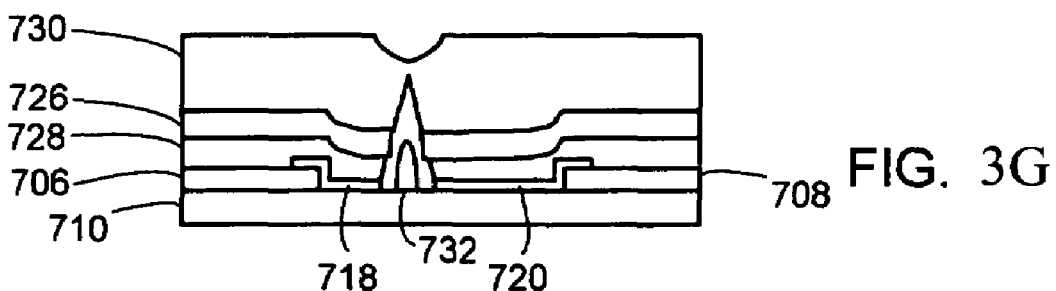

Turning to FIG. 3G, a gate foot material layer 730 is deposited over a mask formed by the resist layers 726 and 728. Deposition of the gate foot material layer 730 results in the formation of a gate foot 732 on the substrate 710 in the gate foot opening 725 in the mask formed by the resist layers 726 and 728. The gate material is a conductive material, which typically is a metal such as gold or the like. An optional gate etch such as a wet etch may be performed to slightly etch into the substrate 710 prior to formation of the gate foot 732.

Figure 3H:
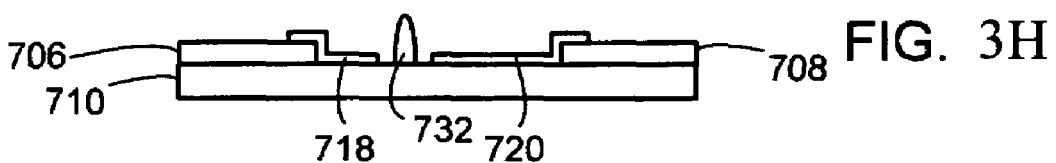

As shown in FIG. 3H, the gate foot material layer 730 is removed along with the resist layers 726 and 728 leaving the gate foot 732 on the substrate 710. For example, the resist layers 726 and 728 with the gate foot material layer 730 thereon, may be removed by using a lift-off process. After the lift-off process, the width (gate length) of the gate foot 732 and the height of the gate foot 732 may be measured, if desired, prior to formation of a gate head 754 (shown in FIG. 3K). This allows the gate length to be measured early in the manufacturing process, even in situ if desired, without requiring destruction of the T-gate device 700 to perform the measurement. The gate etch length and the source-to-gate spacings can also be measured at this time.

Also, electrical measurements of the gate foot 732 may be conducted prior to completion of the T-gate device 700 (FIG. 2). For example, DC measurements may be made to determine if the gate foot 732 is functioning properly. Thus, it is possible to make measurements of the transconductance, resistance, etc., prior to completing fabrication of the T-gate device.

Figure 3I:
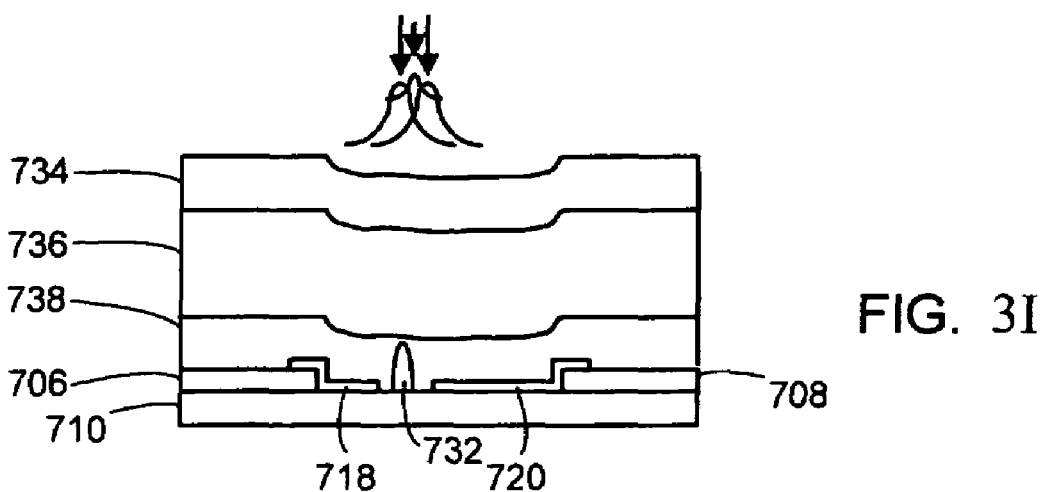

Turning to FIG. 3I, three layers of resist 734, 736, and 738 are deposited over the gate foot 732. Dissimilar resists can be used so that adjacent resist layers do not intermix. The lower resist layer 738 is deposited thick enough to cover the gate foot 732 and may be ZEP 520A. The middle resist layer 736 acts as a spacer between upper and lower resist layers 734 and 738 and can be relatively thick as compared to resist layers 734 and 738. The middle resist layer 736 may be a copolymer, such as MMA(17.5)/MAA. The upper resist layer 734, can be an imaging layer and may be a medium sensitivity resist, such as PMMA 495k.

A third exposure, (indicated as three arrows above three gaussian curves at the top of FIG. 3I) exposes resist layers 734, 736, and 738 and forms a gaussian distribution in the resist layers 734, 736, and 738. Although it is possible to use a single peak gaussian like profile to define a gate head opening 740 (FIG. 3J), the e-beam exposure may use overlapping sidelobe doses with a light centerline dose, as is indicated by the smaller gaussian curve at the top of FIG. 3I. For this third exposure, it is possible to use a low voltage, such as 20 kV. The exposure energy and the develop time are selected so that a top 744 of the gate foot 732 is not covered by resist layers 746, 748, or 750 after developing, but does leave some of the lower resist layer 750 next to the gate foot 732.

Figure 3J:
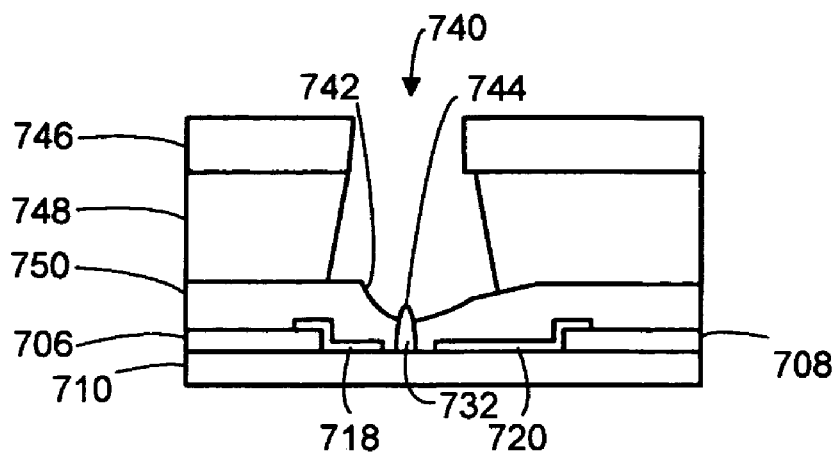

After this third exposure, the resist layers 734, 736, and 738 are developed to create a mask formed by respective resist layers 746, 748, and 750, as is shown in FIG. 3J. The mask formed by the resist layers 746, 748, and 750 includes the gate head opening 740 over the gate foot 732 which exposes the top 744 of the gate foot 732. Thus, the lower resist layer 750 is not developed all the way through to the substrate 710 and does not expose the source 706, the source extension 718, the drain 708, or the drain extension 720. Instead, some of the lower resist layer 750 remains adjacent the sides of the gate foot 732 and over the source 706, the source extension 718, the drain 708, and the drain extension 720 after developing.

Referring to FIGS. 3I and 3J, a developer is selected which removes the exposed portion of the upper resist layer 734 and part of the middle resist layer 736. For example, Methylisobutyl-ketone or MIBK may be used to remove the exposed portion of an upper resist layer 734 formed of PMMA and part of the exposed portion of a middle resist layer 736 formed of MMA(17.5)/MAA copolymer. Next, the exposed portion of the middle resist layer 736 of MMA(17.5)/MAA copolymer is developed with a PMGEA:ETOH (1:5) solution. This solution does not affect the ZEP 520A of the lower resist layer 738 or the PMMA of the upper resist layer 734. Referring to FIG. 3J, the lower resist layer 750 is formed with a dimple 742 by using MIBK developer to remove a portion of the lower resist layer 738 and uncover the top 744 of the gate foot 732. As discussed above with reference to FIG. 3I, the exposure energy, the type and strength of the developer, and the develop times are selected to ensure that only a top portion 744 of the gate foot 732 is uncovered without uncovering the substrate layer 710, the source 706, the source extension 718, the drain 708, or the drain extension 720.

Figure 3K:
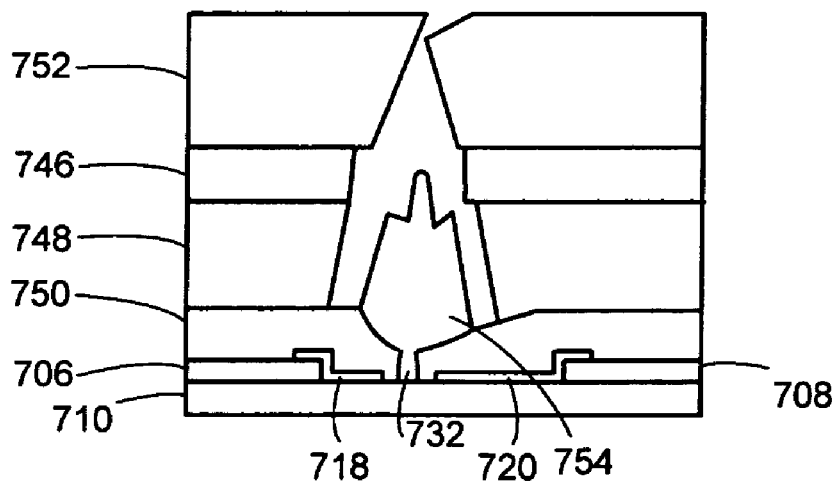

It should be noted that although the above implementation is discussed with reference to exposure followed by the develop stages, it is possible in other implementations to perform the exposure and develop of resist layers 734, 736, and 738 in one or more alternating exposure and develop stages. In some implementations, it is possible to inspect resist layer 750 to determine if the top 744 of the gate foot 732 is uncovered, before deposition of the gate head 754 (FIG. 3K). If the top 744 of the gate foot 732 is not uncovered, an additional exposure and/or develop may be performed to uncover the top 744 of the gate foot 732. The gate foot 732 may be distinguishable from the resist layer 750 by inspection, such as with an electron microscope, or other inspection tool. As such, it is possible to verify in situ whether the processes parameters, such as for example the exposure dosages and develop times are providing the best possible process uniformity. This provides process feedback that allows refinement of the parameters without having to complete fabrication of the device. It also allows for remedial action prior to complete fabrication of the device.

In one possible implementation, after developing the lower resist layer 750 to uncover the top 744 of the gate foot 732, an etch may be performed to remove any surface passivation, or oxidation, from the top 744 of the gate foot 732 prior to deposition of the gate head 754. For example, if a passivation process is used as disclosed in the above referenced application by Milosavljevic, et al., entitled PASSIVATED TIERED GATE STRUCTURE TRANSISTOR AND FABRICATION METHOD, incorporated by reference. This ensures good electrical properties at the interface of the gate foot 732 and the gate head 754.

The resist profile of the resist layers 746, 748, and 750 forms the mask that defines the gate head 754. Since a continuous profile faces the deposition source, during deposition, no voids will form between the gate foot 732 and the gate head 754. As shown in FIG. 3K, a gate head material layer 752 is deposited over the mask including the resist layers 746, 748, and 750 to form the gate head 754 on the top 744 of the gate foot 732 in the gate head opening 740. The gate head material layer 752 may be deposited by various deposition techniques known in the art, such as for example by chemical vapor deposition. The opening 740 in the mask formed by resist layers 746, 748, and 750 defines the gate head 754 during the gate head deposition process.

Referring to FIG. 3K, the gate head material layer 752 is removed along with the resist layers 746, 748, and 750 to leave the T-gate device 700 on the substrate 710, shown in FIG. 2. For example, the gate head material layer 752 and the resist layers 746, 748, and 750 may be removed with a lift-off process by stripping the resist layers 746, 748, and 750 with a solvent, such as acetone. Other resists, developers, and stripper solutions are possible, but should be compatible with the particular substrate material being utilized, i.e. InP, GaAs, GaN, Si, SiC, etc. The source extension 718 and the drain extension 720 have a thickness that is less than the thickness of the respective source 706 and drain 708. In this way, the gate head 754 may be formed over the source extension 718 and the drain extension 720 without creating a short with the gate head 754. In addition, the gate-to-source resistance or the gate-to-drain resistance of the T-gate device 700, or both, may be reduced to improve the gain and frequency response of the T-gate device 700. For example, the T-gate device 700 may operate effectively at a frequency of 600 GHz or more.

Some implementations provide the ability to increase distance between the gate head and substrate to reduce the gate to source capacitance and the gate to drain capacitance. Furthermore, some implementations, allow in situ evaluation of gate length prior to complete fabrication, allowing verification of process parameters during processing, in situ, leading to greater uniformity and yields. Further, improved uniformity across a wafer is achievable.

T-gate device 700 of FIG. 2 may be a T-gate transistor constructed of indium phosphide, gallium arsenide, gallium nitride, or antimonide. With some of the above described implementations, it is possible to produce ultra-short, T-gate structures for HEMT, HFET, PHEMT, and MESFET devices having low access resistances. Certain implementations may be used to produce reliable T-gate structures for sub-millimeter wave devices, devices with operating frequencies above 300 GHz.

The above implementations are not limited to the example resists and developers discussed above, or to specific exposure levels. Other types of resists and developers, and different exposures, may be used. Although the above is shown with a symmetric T-gate structure, embodiments may include other tiered gate structures including but not limited to gamma gate and Y-gate structures with source and/or drain extension as shown herein. Examples of gamma gate and Y-gate structures are shown in copending U.S. application Ser. No. 11/150,439, by Milosavljevic, et al., filed Jun. 11, 2005, entitled METHOD FOR PRODUCING TIERED GATE STRUCTURE DEVICES, which is incorporated by reference in its entirety. Moreover, the present invention is not limited to these types. The implementations and embodiments disclosed herein may be used in conjunction with the implementations/embodiments of the above referenced applications. Further, the above disclosed implementations are not limited to soft masks and may include hard masks.

Having described this invention in connection with a number of implementations and embodiments, modification will now certainly suggest itself to those skilled in the art. The invention is not intended to be limited to the disclosed implementations and embodiments, except as required by the appended claims.

What is claimed is:

1. A method for fabricating a tiered gate device comprising:
   forming a source on a substrate;
   forming a drain on the substrate;
   forming a gate foot between the source and the drain;
   forming at least one of: (1) a source extension extending from on an uppermost surface of the source to and along the substrate toward a gate foot location with the source extension electrically contacting the source; or (2) a drain extension extending from on an uppermost surface of the drain to and along the substrate toward a gate foot location with the drain extension electrically contacting the drain; and
   forming a gate head on the gate foot.

2. The method of claim 1, comprising forming the at least one of the source extension or the drain extension prior to forming the gate foot.

3. The method of claim 2, comprising forming the at least one of the source extension or the drain extension comprising a multiple layers of metal.

4. The method of claim 3, comprising forming the at least one of the source extension or the drain extension comprising: AuGe; Ni; and Au.

5. The method of claim 4 further comprising annealing the at least one of the source extension or the drain extension.

6. The method of claim 1, wherein forming the gate foot comprises:
   forming a gate foot mask over the at least one of the source extension or the drain extension, the gate foot mask having an opening therethrough;
   forming the gate foot in the opening of the gate foot mask; and
   removing the gate foot mask.

7. The method of claim 6, wherein forming the gate foot mask comprises:
   depositing a low sensitivity resist over a high sensitivity resist;
   exposing the low sensitivity resist and the high sensitivity resist; and
   developing the low sensitivity resist and the high sensitivity resist.

8. The method of claim 7, wherein forming the gate head mask comprises:
   forming a lower mask layer on the gate foot;
   forming an intermediate mask layer on the lower mask layer;
   forming an upper mask layer on the intermediate mask layer; and
   forming an opening through the upper mask layer, the intermediate mask layer, and the lower mask layer to expose the top portion of the gate foot.

9. The method of claim 1, wherein forming the source comprises forming a metal having a thickness, and wherein forming the source extension comprises forming the source extension having a thickness less than the thickness of the source metal.

10. The method of claim 1, wherein forming the drain comprises forming a metal having a thickness, and wherein forming the drain extension comprises forming the drain extension having a thickness less than the thickness of the drain metal.

11. The method of claim 1, wherein forming the at least one of the source extension or the drain extension comprises:
    covering a portion of the substrate at a gate foot location on the substrate with a mask;
    depositing a conductive material on and adjacent to the mask; and
    performing a lift off process of the mask to remove the conductive material thereon.

12. The method of claim 1, wherein forming at least one of the source extension or the drain extension comprises forming the source extension.

13. The method of claim 1, wherein forming the at least one of the source extension or the drain extension comprises forming the drain extension.

14. The method of claim 1, wherein forming at least one of a source extension or a drain extension comprises forming both the source extension and the drain extension.

15. The method of claim 14, wherein forming the source extension and the drain extension comprises performing a deposition process using a mask covering a gate foot location of the substrate, followed by a lift off process prior to forming the gate foot.

16. A method for fabricating a tiered gate device comprising:
    forming a source on a substrate;
    forming a drain on the substrate;
    forming a source extension, wherein forming the source extension comprises masking a portion of the substrate at a gate foot location on the substrate and depositing a metal comprising layer extending along at least a portion of an uppermost surface of the source and along the substrate toward the rate foot location;

forming a gate foot between the source and the drain; and forming a gate head on the gate foot.

17. The method of claim 16, wherein forming the source extension comprises forming the source extension extending along the substrate such that the source extension will extend from the portion of the uppermost surface of the source to under the gate head after gate head formation.

18. The method of claim 17 further comprising forming a drain extension comprising depositing the metal comprising layer extending along at least a portion of an uppermost surface of the drain and along the substrate, and wherein forming the drain extension comprises forming the drain extension extending along the substrate such that the drain extension will extend from the portion of the uppermost surface of the drain to under the gate head after gate head formation.

19. The method of claim 17, wherein forming the gate foot comprises forming the gate foot between the source extension and the drain extension.

20. The method of claim 16 further comprising forming a drain extension comprising depositing the metal comprising layer extending along at least a portion of an uppermost surface of the drain and along the substrate.

21. The method of claim 16 comprising performing a lift off process to form the source extension.

22. A method for fabricating a tiered gate device comprising:

forming a source on a substrate;

forming a drain on the substrate;

forming a drain extension, wherein forming the drain extension comprises masking a portion of the substrate at a gate foot location on the substrate and depositing a metal comprising layer extending along at least a portion of an uppermost surface of the drain and along the substrate toward the gate foot location;

forming a gate foot between the source and the drain; and forming a gate head on the gate foot.

23. The method of claim 22 comprising performing a lift off process to form the drain extension.

24. The method of claim 22, wherein forming the drain extension comprises forming the drain extension extending along the substrate such that the drain extension will extend under the gate head after gate head formation.

25. The method of claim 22, wherein forming the gate foot comprises forming the gate foot between the source and the drain extension.

\* \* \* \* \*